United States Patent
Lu et al.

(10) Patent No.: US 10,304,963 B2
(45) Date of Patent: May 28, 2019

(54) POLYSILICON THIN FILM TRANSISTOR AND MANUFACTURING METHOD THEREOF, ARRAY SUBSTRATE, DISPLAY PANEL

(71) Applicant: BOE TECHNOLOGY GROUP CO., LTD., Beijing (CN)

(72) Inventors: Xiaoyong Lu, Beijing (CN); Dong Li, Beijing (CN); Zheng Liu, Beijing (CN); Shuai Zhang, Beijing (CN); Liang Sun, Beijing (CN); Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/083,646

(22) Filed: Mar. 29, 2016

(65) Prior Publication Data
US 2016/0300858 A1 Oct. 13, 2016

(30) Foreign Application Priority Data

Apr. 9, 2015 (CN) .......................... 2015 1 0166484

(51) Int. Cl.
H01L 29/786 (2006.01)
H01L 29/66 (2006.01)
H01L 21/265 (2006.01)

(52) U.S. Cl.
CPC .. H01L 29/78696 (2013.01); H01L 29/66492 (2013.01); H01L 29/66537 (2013.01);
(Continued)

(58) Field of Classification Search
CPC ........... H01L 27/1222; H01L 29/66492; H01L 29/66537; H01L 29/66757;
(Continued)

(56) References Cited

U.S. PATENT DOCUMENTS 6,747,325 B2 * 6/2004 Shih .................. H01L 21/26586
257/344
2006/0022270 A1 * 2/2006 Boyd ................ H01L 21/76283
257/351
2012/0146109 A1 6/2012 Yamazaki et al.

FOREIGN PATENT DOCUMENTS

CN 1198596 A 11/1998
CN 1397995 A 2/2003
(Continued)

OTHER PUBLICATIONS

Office Action in Chinese Application No. 201510166484.1 dated Apr. 1, 2017, with English translation. 11 pages.
(Continued)

Primary Examiner — Matthew C Landau
Assistant Examiner — Dmitriy Yemelyanov
(74) Attorney, Agent, or Firm — Womble Bond Dickinson (US) LLP

(57) ABSTRACT

The embodiments of the present disclosure provide a polysilicon thin film transistor and manufacturing method thereof, an array substrate, and a display panel. The method for manufacturing a polysilicon thin film transistor comprises: forming, on a substrate, a gate, a source and a drain, and an active layer. Forming the active layer comprises: forming a polysilicon layer on the substrate, which comprises a channel region and extension regions; performing ion injection process in the extension regions to form lightly-doped regions close to the channel region and a source region and a drain region; prior to or following the formation of the lightly-doped regions, employing halo ion injection process to form halo regions at the positions of the channel region which are close to the lightly-doped regions.

20 Claims, 10 Drawing Sheets

(52) U.S. Cl.
CPC .. *H01L 29/66757* (2013.01); *H01L 29/78621* (2013.01); *H01L 29/78675* (2013.01); *H01L 21/26586* (2013.01)

(58) Field of Classification Search
CPC ......... H01L 29/78621; H01L 29/78675; H01L 29/78696; H01L 27/127; H01L 27/12; H01L 29/66; H01L 29/786
See application file for complete search history.

(56) References Cited

FOREIGN PATENT DOCUMENTS

| | | |
|---|---|---|
| CN | 102723307 A | 10/2012 |
| CN | 103151388 A | 6/2013 |

OTHER PUBLICATIONS

"Second office action," CN Application No. 201510166484.1 (dated Dec. 11, 2017).
"Decision on Rejection," CN Application No. 201510166484.1 (dated Jun. 1, 2018).

\* cited by examiner

POLYSILICON THIN FILM TRANSISTOR AND MANUFACTURING METHOD THEREOF, ARRAY SUBSTRATE, DISPLAY PANEL

RELATED APPLICATIONS

The present application claims the benefit of Chinese Patent Application No. 201510166484.1, filed Apr. 9, 2015, the entire disclosure of which is incorporated herein by reference.

FIELD

The present disclosure relates to the field of display technologies, particularly to a polysilicon thin film transistor and manufacturing method thereof, an array substrate and a display panel.

BACKGROUND

The display device having a low temperature polysilicon thin film field effect transistor (LTPS-TFT) array substrate has advantages including high resolution, fast response speed, high brightness, high aperture ratio, and the like. Furthermore, due to the characteristics of LTPS, it has high electron mobility.

As the LTPS-TFT array substrate develops towards the direction of high resolution, and the LTPS-TFT is also gradually made smaller and smaller, it would necessarily lead to reduction in the effective channel length in the thin film field effect transistor, thereby resulting in short-channel effects mainly including short channel that influences the threshold voltage, narrow channel effect, mobility field-related effect and carrier velocity saturation effect, hot carrier effect that influences the life of device, sub-threshold characteristic degradation, and so on.

SUMMARY

Embodiments of the present disclosure provide a polysilicon thin film transistor and manufacturing method thereof, an array substrate and a display panel, which can at least alleviate or eliminate one or more of the aforementioned problems.

According to a first aspect of the present disclosure, a method for manufacturing a polysilicon thin film transistor is provided, which comprises: forming, on a substrate, a gate, a source and a drain, and an active layer; wherein forming the active layer comprises: forming a polysilicon layer on the substrate, the polysilicon layer comprising a channel region and extension regions; performing ion injection process in the extension regions to form lightly-doped regions close to two sides of the channel region and a source region and a drain region located respectively at one side of the lightly-doped regions far from the channel region; employing halo ion injection process to form halo regions at the positions of the channel region which are close to the lightly-doped regions; wherein the type of ions injected into the halo regions is opposite to the type of ions injected into the lightly-doped regions, the energy of ions injected into the halo regions is greater than the energy of ions injected into the lightly-doped regions, the dose of ions injected into the halo regions is smaller than the dose of ions injected into the lightly-doped regions.

In a possible implementation of the first aspect, forming the active layer specifically comprises: forming a polysilicon layer on the substrate, the polysilicon layer comprising a channel region and extension regions; by taking the gate formed above the channel region of the polysilicon layer as a barrier, performing first ion injection process in the extension regions not blocked by the gate, and employing halo ion injection process to form the halo regions at the positions of the channel region which are close to the lightly-doped regions; wherein the types of ions injected by the first ion injection process and the halo ion injection process are opposite, the energy of ions injected by the first ion injection process is smaller than the energy of ions injected by the halo ion injection process, the dose of ions injected by the first ion injection process is larger than the dose of ions injected by the halo ion injection process; forming a first organic photosensitive resin pattern above the extension regions, the first organic photosensitive resin pattern covering the lightly-doped regions to be formed, performing second ion injection process by taking the first organic photosensitive resin pattern as a barrier to form a source region and a drain region, while the extension regions covered by the first organic photosensitive resin pattern forming the lightly-doped regions; wherein the ion type of the second ion injection process is identical with the ion type of the first ion injection process; removing the first organic photosensitive resin pattern.

In combination with the above possible implementation of the first aspect, in another possible implementation, said performing first ion injection process in the extension regions and employing halo ion injection process to form the halo regions at the positions of the channel region which are close to the lightly-doped regions comprise: firstly performing first ion injection process in the extension regions, then employing halo ion injection process to form the halo regions at the positions of the channel region which are close to the lightly-doped regions; or, firstly employing halo ion injection process to form the halo regions at the positions of the channel region which are close to the lightly-doped regions to be formed, then performing first ion injection process in the extension regions.

In a further possible implementation of the first aspect, forming the active layer specifically comprises: forming a polysilicon layer on the substrate, the polysilicon layer comprising a channel region and extension regions; forming a second organic photosensitive resin pattern above the polysilicon layer, the second organic photosensitive resin pattern exposing the source region and the drain region to be formed in the extension regions, and performing first ion injection process by taking the second organic photosensitive resin pattern as a barrier to form the source region and the drain region; removing the second organic photosensitive resin pattern; performing second ion injection process by taking the gate formed above the channel region of the polysilicon layer as a barrier to form the lightly-doped regions in the areas of the extension regions except the source region and the drain region, and employing halo ion injection process to form the halo regions at the positions of the channel region which are close to the lightly-doped regions; wherein the type of ions injected by the second ion injection process is identical with the type of ions injected by the first ion injection process and opposite to the type of ions injected by the halo ion injection process, the energy of ions injected by the second ion injection process is smaller than the energy of ions injected by the halo ion injection process, and the dose of ions injected by the second ion injection process is larger than the dose of ions injected by the halo ion injection process.

In combination with the above possible implementation of the first aspect, in yet another possible implementation, said performing second ion injection process by taking the gate formed above the polysilicon layer as a barrier to form the lightly-doped regions in the areas of the extension regions except the source region and the drain region, and employing halo ion injection process to form the halo regions at the positions of the channel region which are close to the lightly-doped regions comprise: taking the gate formed above the polysilicon layer as a barrier, firstly performing second ion injection process to form the lightly-doped regions in the areas of the extension regions except the source region and the drain region, then employing halo ion injection process to form the halo regions at the positions of the channel region which are close to the lightly-doped regions; or, taking the gate formed above the polysilicon layer as a barrier, firstly performing halo ion injection process to form the halo regions at the positions of the channel region which are close to the lightly-doped regions to be formed, then performing second ion injection process to form the lightly-doped regions in the areas of the extension regions except the source region and the drain region.

In a possible implementation of the first aspect, the halo ion injection process comprises: when a bearing substrate of a halo ion injection machine where the substrate is placed is rotated to a predetermined angle and a predetermined inclination, performing first halo ion injection process;

rotating the bearing substrate of the halo ion injection machine by 90° with respect to the predetermined angle in a clockwise or anticlockwise direction, performing second halo ion injection process; continuing to rotate the bearing substrate by 90° in the same direction as the second halo ion injection process, performing third halo ion injection process;

continuing to rotate the bearing substrate by 90° in the same direction as the third halo ion injection process, performing fourth halo ion injection process; wherein the predetermined inclination is unchanged during the four halo ion injection processes.

In combination with the above possible implementation of the first aspect, in another possible implementation, taking the plane of the polysilicon layer as a reference, the predetermined inclination is in an angular range of 0 to 30°.

In combination with the above various possible implementations, in a further possible implementation, the ions in the lightly-doped regions are of n-type, the ions in the halo regions are of p-type; or, the ions in the lightly-doped regions are of p-type, the ions in the halo regions are of n-type.

According to a second aspect of the present disclosure, a polysilicon thin film transistor is provided, which comprises: a gate, a source and a drain, and an active layer arranged on a substrate. The active layer comprises: a channel region, a source region and a drain region, lightly-doped regions located between the channel region and the source region and between the channel region and the drain region, and halo regions located at the positions of the channel region which are close to the lightly-doped regions; wherein the halo regions contact the portions of the lightly-doped regions and the channel region which are close to the substrate; the type of ions in the halo regions is opposite to the type of ions in the lightly-doped regions.

In a possible implementation of the second aspect, the ions in the lightly-doped regions are of n-type, the ions in the halo regions are of p-type; or, the ions in the lightly-doped regions are of p-type, the ions in the halo regions are of n-type.

According to a third aspect of the present disclosure, an array substrate is provided, which comprises the polysilicon thin film transistor of the second aspect.

According to a fourth aspect of the present disclosure, a display panel is provided, which comprises the array substrate of the third aspect.

The embodiments of the present disclosure provide a polysilicon thin film transistor and manufacturing method thereof, an array substrate and a display panel, wherein the manufacturing method of a polysilicon thin film transistor comprises: forming, on a substrate, a gate, a source and a drain, and an active layer. Forming the active layer comprises: forming a polysilicon layer on the substrate, the polysilicon layer comprising a channel region and extension regions; performing ion injection process in the extension regions to form lightly-doped regions close to two sides of the channel region and a source region and a drain region located respectively at one side of the lightly-doped regions which is far from the channel region; employing halo ion injection process to form halo regions at the positions of the channel region which are close to the lightly-doped regions; wherein the type of ions injected into the halo regions is opposite to the type of ions injected into the lightly-doped regions, the energy of ions injected into the halo regions is greater than the energy of ions injected into the lightly-doped regions, and the dose of ions injected into the halo regions is smaller than the dose of ions injected into the lightly-doped regions. Since the halo regions are formed between the channel region and the lightly-doped regions, and the type of ions in the halo regions is opposite to the type of ions in the lightly-doped regions, the halo regions can effectively inhibit the ions in the lightly-doped regions from diffusing to the channel region such that the depletion region is reduced, thereby suppressing the punchthrough effect and further preventing the short-channel effects efficiently.

BRIEF DESCRIPTION OF DRAWINGS

To set forth the embodiments of the present disclosure or the prior art technical solutions more clearly, the figures needed for describing the embodiments or the prior arts will be simply introduced as follows. Obviously, the figures described below are just some embodiments of the present disclosure. Those ordinarily skilled in the art may further obtain other figures based on these figures without spending inventive efforts.

FIG. 3b is a structural schematic diagram of forming halo regions after performing halo ion injection process on the basis of FIG. 3a.

FIG. 4b is a structural schematic diagram of forming a source region and a drain region after performing second ion injection process on the basis of FIG. 4a.

FIG. 5b is a structural schematic diagram of forming lightly-doped regions after performing second ion injection process on the basis of FIG. 5a.

REFERENCE SIGNS

10—substrate; 11—gate; 12—source; 13—drain; 14—active layer; 140—extension region; 141—channel region; 142—lightly-doped region; 143—source region; 144—drain region; 145—halo region; 15—first organic photosensitive resin pattern; 16—second organic photosensitive resin pattern; 17—first electrode.

DETAILED DESCRIPTION

The technical solutions in the embodiments of the present disclosure will be described as follows clearly and comprehensively in connection with the figures in the embodiments of the present disclosure. Obviously, the described embodiments are just a part of the embodiments of the present disclosure rather than all of them. Based on the embodiments of the present disclosure, all other embodiments obtained by those ordinarily skilled in the art without spending inventive efforts pertain to the protection scope of the present disclosure.

Figure 1:
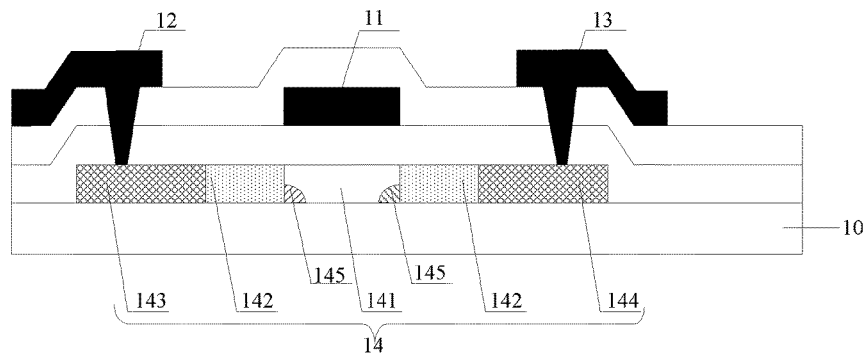
FIG. 1 is a structural schematic diagram of a polysilicon thin film transistor provided by the embodiments of the present disclosure.
Figure 8:
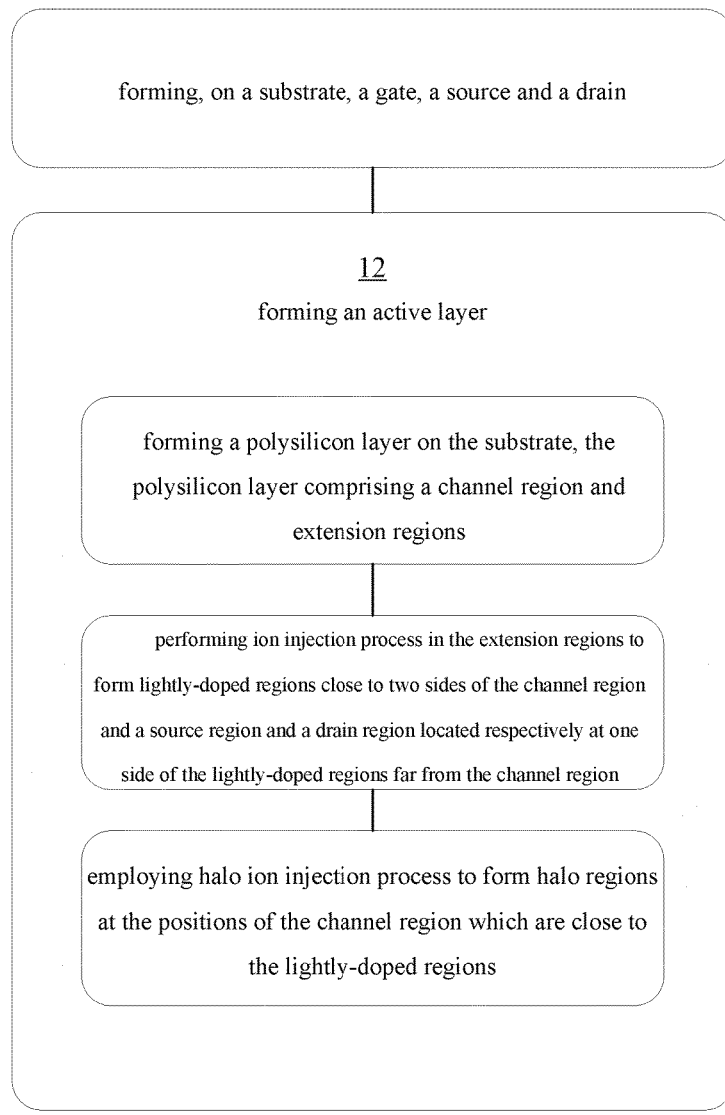
FIG. 8 is a flow chart of a method for manufacturing a polysilicon thin film transistor as provided by the embodiments of the present disclosure.

Embodiments of the present disclosure provide a method for manufacturing a polysilicon thin film transistor as shown in FIG. 1, comprising, as shown FIG. 8, forming on a substrate 10 a gate 11, a source 12 and a drain 13, and an active layer 14. Forming the active layer 14 comprises: forming a polysilicon layer on the substrate 10, the polysilicon layer comprising a channel region 141 and extension regions; performing ion injection process in the extension regions to form lightly-doped regions 142 close to the channel region and a source region 143 and a drain region 144 located respectively at one side of the lightly-doped regions 142 which is far from the channel region 141; prior to or following formation of the lightly-doped regions 142, employing halo ion injection process to form halo regions 145 at the positions of the channel region 141 which are close to the lightly-doped regions 142.

In the polysilicon thin film transistor as shown in FIG. 1, the type of ions injected into the halo regions 145 is opposite to the type of ions injected into the lightly-doped regions 142, the energy of ions injected into the halo regions 145 is greater than the energy of ions injected into the lightly-doped regions 142, the dose of ions injected into the halo regions 145 is smaller than the dose of ions injected into the lightly-doped regions 142.

Here, the energy of ions injected into the halo regions 145 being greater than the energy of ions injected into the lightly-doped regions 142 specifically indicates, during the formation of the halo regions 145, injecting high-energy ion beams into an area where the halo regions 145 are to be formed, and injecting low-energy ion beams to an area where the lightly-doped regions 142 are to be formed, wherein the mentioned high energy and low energy are only used with respect to the formation of the halo regions 145 and the lightly-doped regions 142, which are incomparable with the energies of injected ions at the time of forming other regions.

In the embodiments of the present disclosure, forming a polysilicon layer on the substrate may, for example, be: depositing a layer of amorphous silicon layer using plasma enhanced chemical vapor deposition (PECVD for short), performing dehydrogenation process in the amorphous silicon layer using a high temperature oven so as to prevent occurrence of a hydrogen decrepitation phenomenon during crystallization and decrease defective states density effect within the thin film after crystallization; following the dehydrogenation process, performing low temperature polysilicon (LTPS for short) process, performing crystallization of the amorphous silicon layer using crystallization measures such as laser annealing process (ELA), metal-induced crystallization process (MIC), solid phase crystallization process (SPC), etc to form a polysilicon layer on the substrate.

Certainly, the embodiments of the present disclosure are not limited to the above low temperature polysilicon process, and may also be high temperature polysilicon, which are not specifically defined here, as long as the polysilicon layer can be formed.

It is noted that, firstly, the substrate is not limited, which may be a base substrate provided with no film layer, and may also be a substrate provided with some film layers. For example, the substrate may be a substrate already provided with a buffer layer on the base substrate, which may be specifically set based on the practical situation and not defined here.

Secondly, those skilled in the art should understand that the type of ions doped into the lightly-doped regions 142 is identical with the type of ions doped into the source region 143 and the drain region 144, and the dose of ions doped into the lightly-doped regions 142 is smaller than the dose of ions doped into the source region 143 and the drain region 144.

Thirdly, when halo ions are injected, the type, energy and dose of ions are not specifically limited, which need to be determined in dependence on the type, energy and dose of ions in the lightly-doped regions 142 so as to form the halo regions 145 that are formed by the halo ion injection at the positions of the channel region 141 which are close to the lightly-doped regions 142, and, as shown in FIG. 1, enable the halo regions 145 to contact the portions of the lightly-doped regions 142 and the channel region 141 which are close to the substrate.

Fourthly, the time point for performing the halo ion injection process is not limited in the embodiments of the present disclosure, and the process may be performed prior to formation of the lightly-doped regions 142 and may also be preformed following formation of the lightly-doped regions 142.

The embodiments of the present disclosure provide a method for manufacturing a polysilicon thin film transistor, comprising: forming, on a substrate 10, a gate 11, a source 12 and a drain 13, and an active layer 14. Forming the active layer 14 comprises: forming a polysilicon layer on the substrate 10, the polysilicon layer comprising a channel region 141 and extension regions; performing ion injection process in the extension regions to form lightly-doped regions 142 close to two sides of the channel region and a source region 143 and a drain region 144 located respectively at one side of the lightly-doped regions 142 which is far from the channel region 141; employing halo ion injection process to form halo regions 145 at the positions of the channel region 141 which are close to the lightly-doped regions 142; wherein the type of ions injected into the halo regions 145 is opposite to the type of ions injected into the lightly-doped regions 142, the energy of ions injected into the halo regions 145 is greater than the energy of ions injected into the lightly-doped regions 142, and the dose of ions injected into the halo regions 145 is smaller than the dose of ions injected into the lightly-doped regions 142. Since the halo regions 145 are formed between the channel region 141 and the lightly-doped regions 142, and the type of ions in the halo regions 145 is opposite to the type of ions in the lightly-doped regions 142, the halo regions 145 can effectively inhibit the ions in the lightly-doped regions 142 from diffusing to the channel region 141 such that the depletion region is reduced, thereby suppressing the punch-through effect and further preventing the short-channel effects efficiently.

The ions in the lightly-doped regions 142 are of n-type, the ions in the halo regions 145 are of p-type; or the ions in the lightly-doped regions 142 are of p-type, the ions in the halo regions 145 are of n-type.

When the ions are of p-type, the injected ions may, for example, be boron ions, indium ions, etc; when the ions are of n-type, the injected ions may, for example, be phosphorus ions, arsenic ions, etc.

Figure 2:
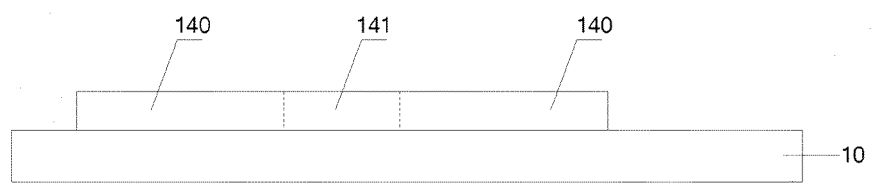
FIG. 2 is a structural schematic diagram of forming a channel region and extension regions on the substrate as provided by the embodiments of the present disclosure.
Figure 9:
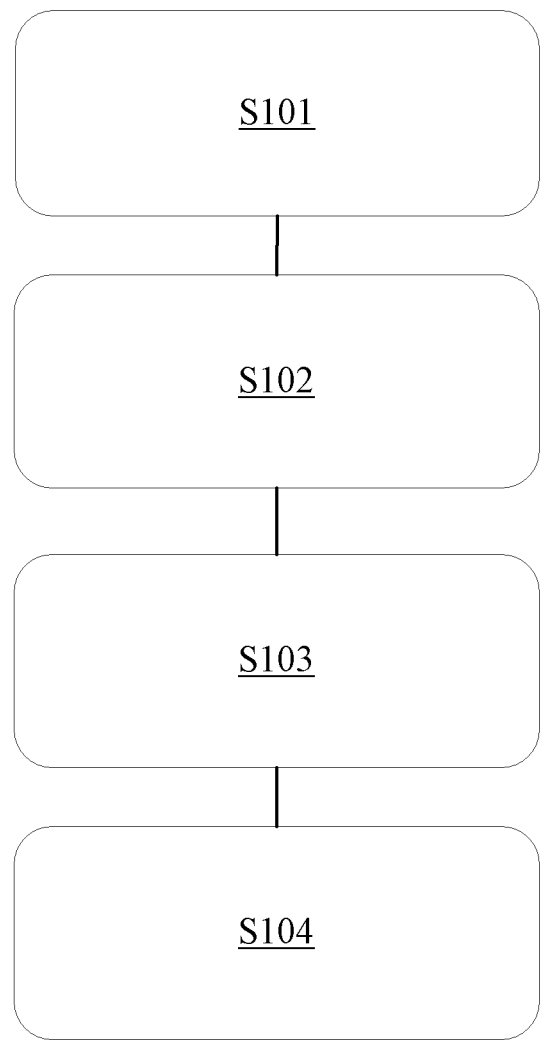
FIG. 9 is a flow chart of the process of forming an active layer as provided by an embodiment of the present disclosure.

In an illustrative embodiment, forming the active layer 14 specifically comprises the following steps (as shown in FIG. 9):

In step S101, as shown in FIG. 2, a polysilicon layer is formed on the substrate 10, the polysilicon layer comprising a channel region 141 and extension regions 140.

Forming the polysilicon layer specifically comprises: depositing an amorphous silicon thin film on the substrate 10, performing crystallization of the amorphous silicon thin film using crystallization measures including ELA, MIC, SPC, etc to form a polysilicon thin film on the substrate, then performing patterning process to form the polysilicon layer.

On such basis, a gate insulating layer and a gate corresponding to the channel region 141 of the polysilicon layer can be formed above the polysilicon layer.

In step S102, taking the gate 11 formed above the channel region 141 of the polysilicon layer as a barrier, first ion injection process is performed in the extension regions 140 that are not blocked by the gate 11, and halo ion injection process is employed to form halo regions 145 at the positions of the channel region 141 which are close to the lightly-doped regions 142.

The type of ions injected by the first ion injection process is opposite to the type of ions injected by the halo ion injection process, the energy of ions injected by the first ion injection process is smaller than the energy of ions injected by the halo ion injection process, and the dose of ions injected by the first ion injection process is larger than the dose of ions injected by the halo ion injection process. For example, the dose of ions injected by the first ion injection process is $5E12/cm^2 \sim 9E13/cm^2$, and the energy thereof is 10 kev~99 kev. The dose of ions injected by the halo ion injection process is $1E11/cm^2 \sim 9E13/cm^2$, and the energy thereof is 20 kev~150 kev.

Figure 3A:
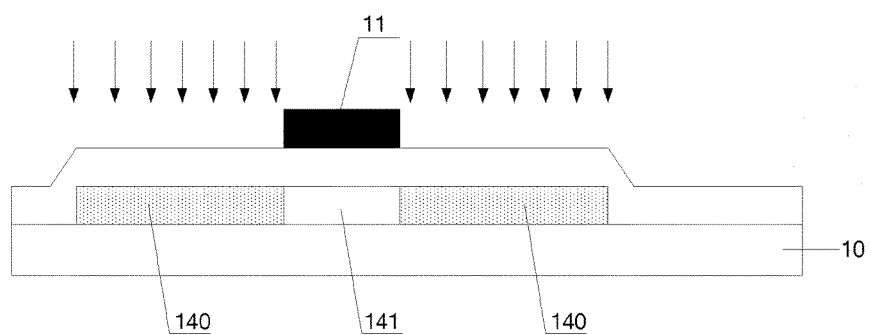
FIG. 3a is a structural schematic diagram after performing first ion injection process in the extension regions on the basis of FIG. 2.
Figure 3B:
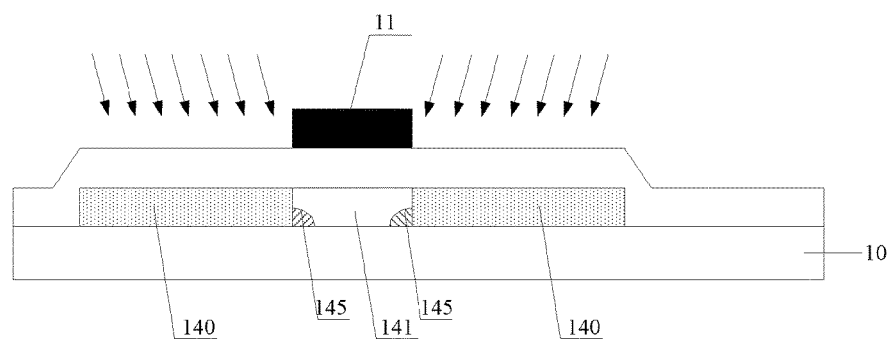

As shown in FIG. 3a, the first ion injection process may be firstly performed to form the lightly-doped regions 142. Thereafter, as shown in FIG. 3b, the halo ion injection process is performed to form the halo regions 145.

Certainly, the halo ion injection process may also be firstly performed to form the halo regions 145 at the positions of the channel region 141 which are close to the lightly-doped regions 142 to be formed, and then the first ion injection process is performed in the extension regions 140. Here, after the first ion injection has been performed in the extension regions 140, the whole extension region 140 is a lightly-doped region. The extension regions not subjected to second ion injection only form the desired lightly-doped regions 142 after step S103 as follows.

On such basis, it can be known that the first ion injection process performs corresponding ion injection process in a light doping manner.

It is noted that since the gate 11 is also taken as a barrier when the halo ion injection process is performed, the ions injected by the halo ion injection process would further exist in the extension regions 140 in addition to being located in the halo regions 145. However, since the dose of ions injected by the halo ion injection process is smaller than the dose of ions injected by the first ion injection process, the ions in the extension regions 140 are mainly of the type of ions injected by the first ion injection process.

Furthermore, since the halo regions 145 are located below the gate 11, when the halo ion injection process is performed, the injection direction is not perpendicular to the polysilicon layer 14, while the halo ion injection process is performed in a non-perpendicular direction with respect to the plane of the polysilicon layer 14.

Figure 4A:
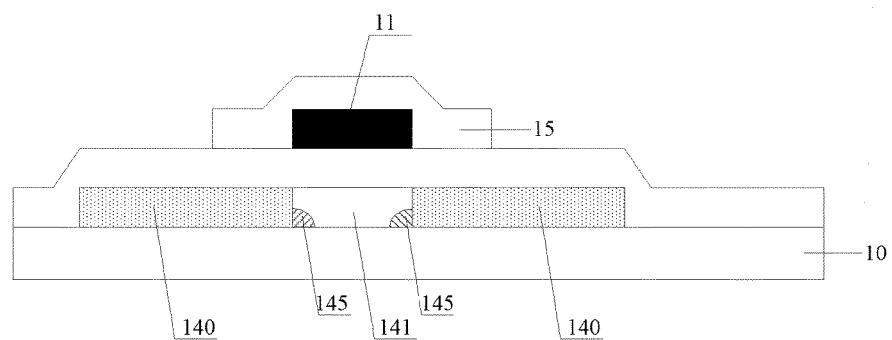
FIG. 4a is a structural schematic diagram of forming a first organic photosensitive resin pattern on the basis of FIG. 3b.
Figure 4B:
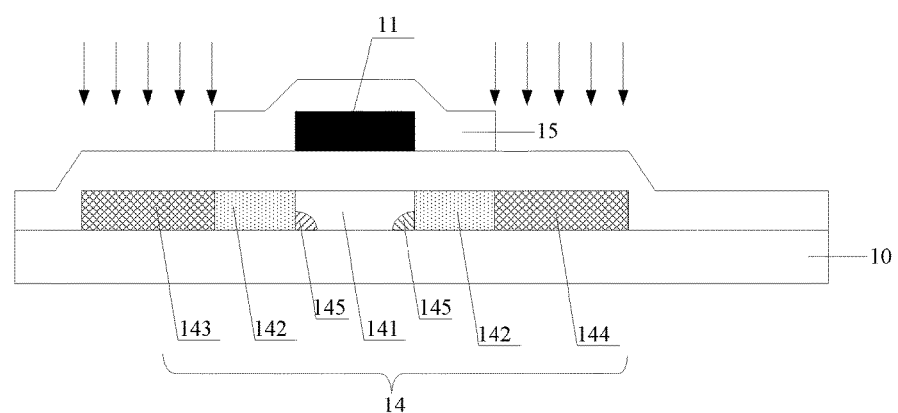

In step S103, as shown in FIGS. 4a and 4b, a first organic photosensitive resin pattern 15 is formed above the extension regions 140. The first organic photosensitive resin pattern 15 covers the lightly-doped regions 142 to be formed. Second ion injection process is performed by taking the first organic photosensitive resin pattern 15 as a barrier to form a source region 143 and a drain region 144, while the extension regions covered by the first organic photosensitive resin pattern 15 form the lightly-doped regions 142, wherein the ion types of the second ion injection process and the first ion injection process are identical.

For example, the dose of ions injected by the second ion injection process is $1E14/cm^2 \sim 1E15/cm^2$, and the energy thereof is 10 kev~150 kev.

Here, the first organic photosensitive resin pattern 15 may only cover the lightly-doped regions 142 to be formed, and may also be as shown in FIG. 4b, i.e. covering both the lightly-doped regions 142 to be formed and the gate 11.

Figure 4C:
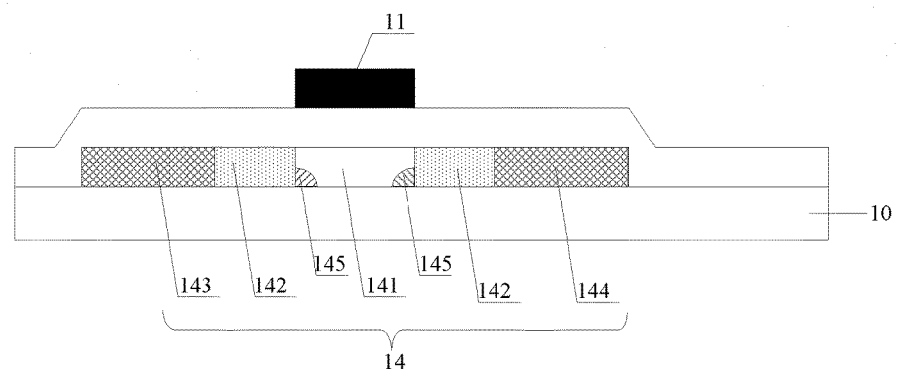
FIG. 4c is a structural schematic diagram of removing the first organic photosensitive resin pattern on the basis of FIG. 4b.

In step S104, as shown in FIG. 4c, the first organic photosensitive resin pattern 15 is removed.

Figure 10:
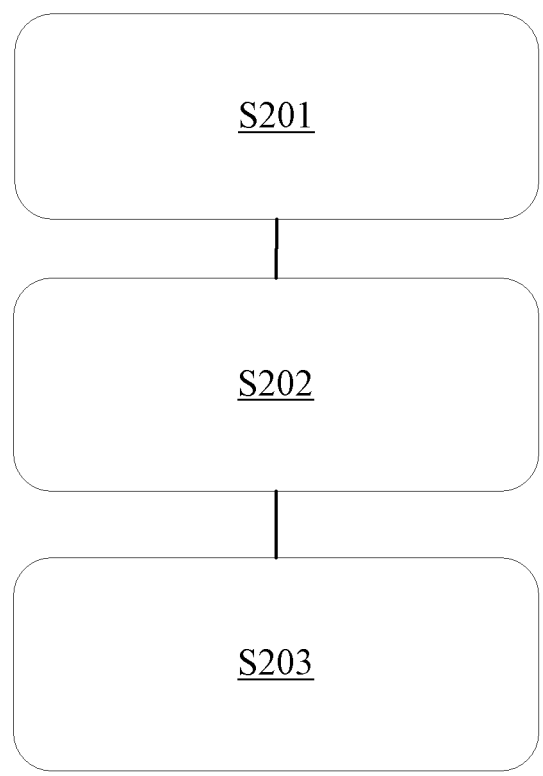
FIG. 10 is a flow chart of the process of forming an active layer as provided by another embodiment of the present disclosure.

According to another illustrative embodiment, forming the active layer 14 may also specifically comprise the following steps (as shown in FIG. 10):

In step S201, as shown in FIG. 2, a polysilicon layer is formed on the substrate 10, the polysilicon layer comprising a channel region 141 and extension regions 140.

Figure 5A:
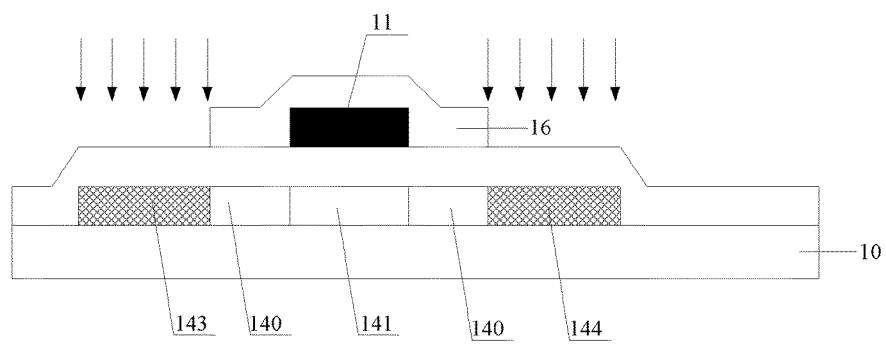
FIG. 5a is a structural schematic diagram of forming a source region and a drain region after performing first ion injection process by taking a second organic photosensitive resin pattern formed above the gate as a barrier as provided by the embodiments of the present disclosure.

In step S202, as shown in FIG. 5a, a second organic photosensitive resin pattern 16 is formed above the polysilicon layer. The second organic photosensitive resin pattern 16 exposes the source region 12 and the drain region 13 to be formed in the extension regions 140, and first ion injection process is performed by taking the second organic photosensitive resin pattern 16 as a barrier to form the source region 12 and the drain region 13.

Namely, through the first ion injection process, a portion of the extension regions 140 becomes the source region 12 and the drain region 13, respectively. On such basis, it can be known that the first ion injection process in said embodiment performs corresponding ion injection process in a high doping manner.

Here, the second organic photosensitive resin pattern 16 may be directly formed above the polysilicon layer, i.e. firstly performing the first ion injection process, then forming the gate 11. Certainly, it is also possible to first form a gate insulating layer and a gate 11 above the polysilicon layer and then form the second organic photosensitive resin pattern 16 according to the manner shown in FIG. 5a.

In step S203, by reference to FIG. 4c, the second organic photosensitive resin pattern 16 is removed, second ion injection process is performed by taking the gate 11 formed above the channel region of the polysilicon layer as a barrier to form the lightly-doped regions 142 in the areas of the extension regions 140 except the source region 12 and the drain region 13, and halo ion injection process is employed to form the halo regions 145 at the positions of the channel region 141 which are close to the lightly-doped regions 142; wherein the type of ions injected by the second ion injection process is identical with the type of ions injected by the first ion injection process and opposite to the type of ions injected by the halo ion injection process, the energy of ions injected by the second ion injection process is smaller than the energy of ions injected by the halo ion injection process, and the dose of ions injected by the second ion injection process is larger than the dose of ions injected by the halo ion injection process.

Figure 5B:
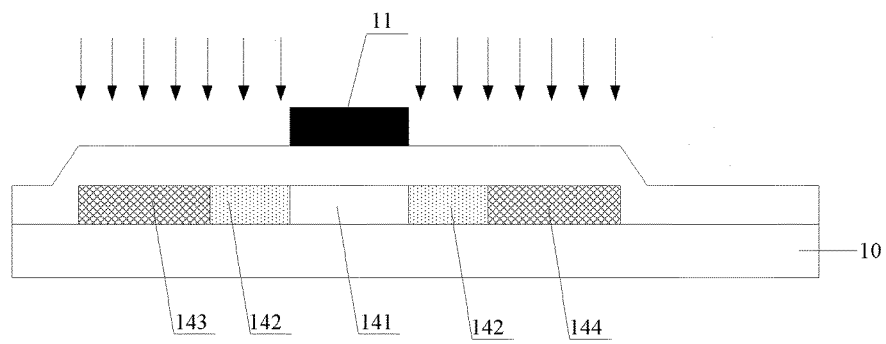
Figure 5C:
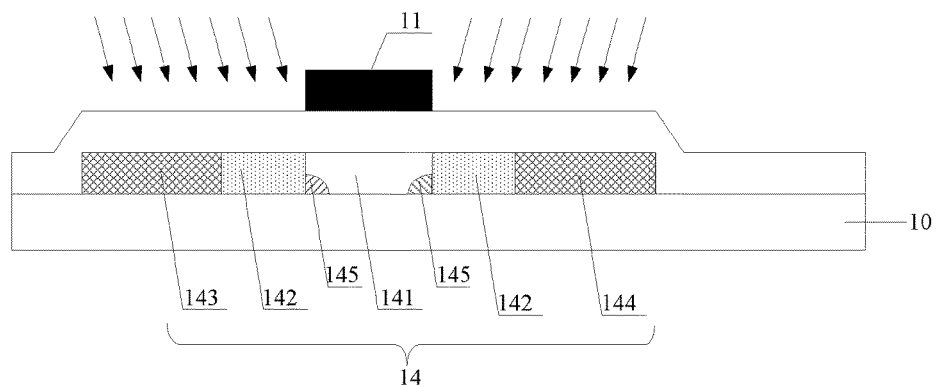
FIG. 5c is a structural schematic diagram of forming halo regions after performing halo ion injection process on the basis of FIG. 5b.

In an illustrative embodiment, as shown in FIG. 5b, the second ion injection process may be firstly performed to form the lightly-doped regions 142. Thereafter, as shown in FIG. 5c, the halo ion injection process is performed to form the halo regions 145.

Certainly, the halo ion injection process may also be performed first to form the halo regions 145, and then the second ion injection process is performed to form the lightly-doped regions 142.

On such basis, it can be known that the second ion injection process in said embodiment performs corresponding ion injection process in a light doping manner.

It is noted that since the second ion injection process and the halo ion injection process are both performed by taking the gate 11 as a barrier, the ions injected by the halo ion injection process would further exist in the source region 143, the drain region 144 and the lightly-doped regions 142 in addition to being located in the halo regions 145. However, since the dose of ions injected by the halo ion injection process is smaller than the dose of ions injected by the second ion injection process, the ions in the lightly-doped regions 142 are still mainly of the type of ions injected by the second ion injection process. Certainly, the ions in the source region 143 and the drain region 144 are also mainly of the type of ions injected by the first ion injection process and the second ion injection process.

In addition, light doping and high doping in all the embodiments of the present disclosure are relative concepts, which just indicate that the dose of ions doped by high doping is larger than the dose of ions doped by light doping.

Furthermore, since the halo regions 145 are located below the gate 11, when the halo ion injection process is performed, the injection direction is not perpendicular to the polysilicon layer 14, while the halo ion injection process is performed in a non-perpendicular direction with respect to the plane of the polysilicon layer 14.

Figure 11:
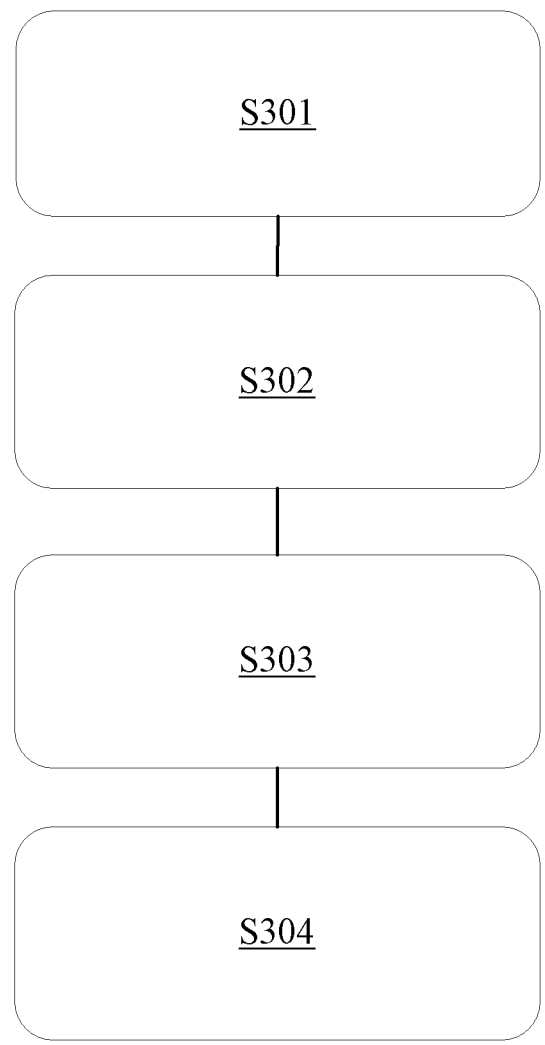
FIG. 11 is a flow chart of the halo ion injection process provided by the embodiments of the present disclosure.

On the basis of the above, the halo ion injection process specifically comprises (as shown in FIG. 11): in step S301, when a bearing substrate of a halo ion injection machine where the substrate 10 is placed is rotated to a predetermined angle and a predetermined inclination, performing first halo ion injection process; in step S302, rotating the bearing substrate of the halo ion injection machine by 90° with respect to the predetermined angle in a clockwise or anti-clockwise direction, performing second halo ion injection process; in step S303, continuing to rotate the bearing substrate by 90° in the same direction as the second halo ion injection process, performing third halo ion injection process; in step S304, continuing to rotate the bearing substrate by 90° in the same direction as the third halo ion injection process, performing fourth halo ion injection process; wherein the predetermined inclination is unchanged during the four halo ion injection processes.

Figure 6A:
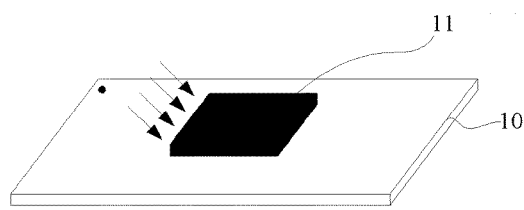
FIGS. 6a-6d are process schematic diagrams of the halo ion injection process provided by the embodiments of the present disclosure.
Figure 6B:
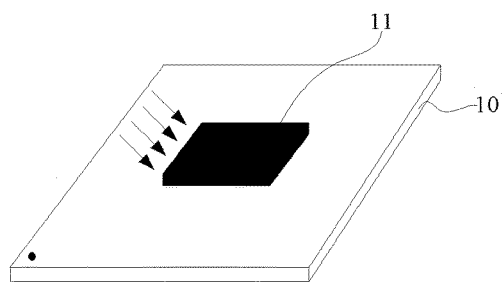
Figure 6C:
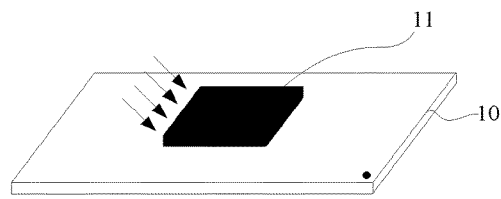
Figure 6D:
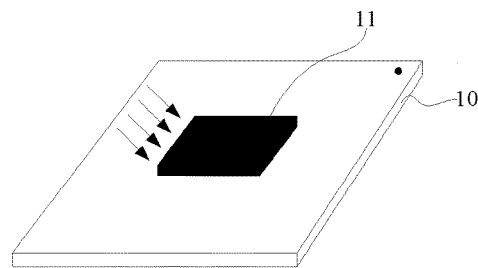

For example, as shown in FIG. 6a, firstly the substrate 10 is fixed to the bearing substrate of the halo ion injection machine and the bearing substrate is rotated to a predetermined angle (taking the blackspot in the figure as a reference) and a predetermined inclination, and first halo ion injection process is performed; then, as shown in FIG. 6b, the bearing substrate of the halo ion injection machine is rotated by 90° in an anticlockwise direction on the basis of FIG. 6a, and second halo ion injection process is performed; thereafter, as shown in FIG. 6c, the bearing substrate of the halo ion injection machine is rotated by 90° in an anticlockwise direction on the basis of FIG. 6b, and third halo ion injection process is performed; finally, as shown in FIG. 6d, the bearing substrate of the halo ion injection machine is rotated by 90° in an anticlockwise direction on the basis of FIG. 6c, and fourth halo ion injection process is performed; wherein the predetermined inclination is unchanged during the four halo ion injection processes.

In this way, the halo regions 145 can be formed at each side of the channel region 140.

Further, taking the plane of the polysilicon layer as a reference, the predetermined inclination in the illustrative embodiments is in an angular range of 0 to 30° so as to form the halo regions 145 at bottom left and bottom right of the lightly-doped regions 142 as shown in FIG. 1.

The embodiments of the present disclosure further provide a polysilicon thin film transistor. As shown in FIG. 1, the polysilicon thin film transistor comprises: a gate 11, a source 12 and a drain 13, and an active layer 14 arranged on a substrate 10; the active layer comprises: a channel region 141, a source region 143 and a drain region 144, lightly-doped regions 142 located between the channel region 141 and the source region 143 and between the channel region 141 and the drain region 144, and halo regions 145 located at the positions of the channel region 141 which are close to the lightly-doped regions 142; wherein the halo regions 145 contact the portions of the lightly-doped regions 142 and the channel region 141 which are close to the substrate 10; the type of ions in the halo regions 145 is opposite to the type of ions in the lightly-doped regions 142.

It is noted that, firstly, the substrate is not limited, which may be a base substrate provided with no film layer, and may also be a substrate provided with some film layers. For example, the substrate may be a substrate already provided with a buffer layer on the base substrate, which may be specifically set based on the practical situation and not defined here.

Secondly, those skilled in the art should understand that the type of ions doped into the lightly-doped regions 142 is identical with the type of ions doped into the source region 143 and the drain region 144, and the dose of ions doped into the lightly-doped regions 142 is smaller than the dose of ions doped into the source region 143 and the drain region 144.

In the polysilicon thin film transistor provided by the embodiments of the present disclosure, since the halo regions 145 are formed between the channel region 141 and the lightly-doped regions 142, and the type of ions in the halo regions 145 is opposite to the type of ions in the lightly-doped regions 142, the halo regions 145 can effectively inhibit the ions in the lightly-doped regions 142 from diffusing to the channel region 141 such that the depletion region is reduced, thereby suppressing the punchthrough effect and further preventing the short-channel effects efficiently.

In the illustrative embodiments, the ions in the lightly-doped regions 142 are of n-type, the ions in the halo regions 145 are of p-type; or the ions in the lightly-doped regions 142 are of p-type, the ions in the halo regions 145 are of n-type; wherein, when the ions are of p-type, the injected ions may, for example, be boron ions, indium ions, etc; when the ions are of n-type, the injected ions may, for example, be phosphorus ions, arsenic ions, etc.

The embodiments of the present disclosure further provide an array substrate, comprising the aforesaid polysilicon thin film transistor.

Figure 7:
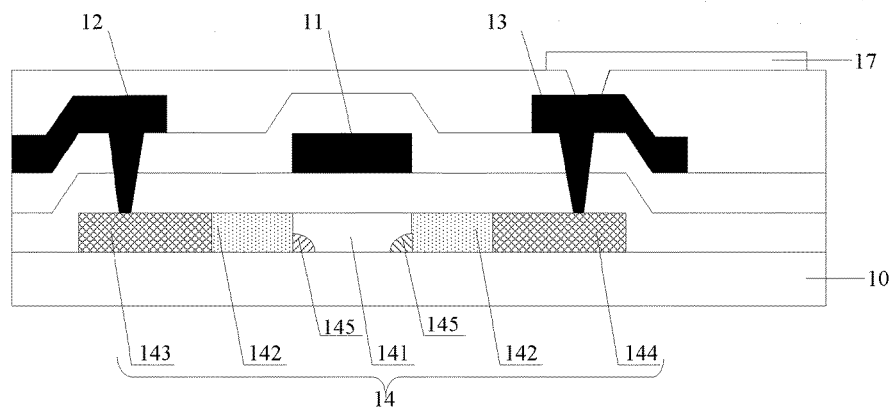
FIG. 7 is a structural schematic diagram of an array substrate provided by the embodiments of the present disclosure.

As shown in FIG. 7, the array substrate further comprises: a first electrode 17 electrically connected to the drain 13.

The first electrode 17 may be a pixel electrode. On such basis, the array substrate is a TFT array substrate. A method for manufacturing the TFT array substrate further comprises: forming a common electrode.

As for an in-plane switch (IPS for short) array substrate, the pixel electrode and the common electrode are arranged alternately in the same layer, both of which are strip electrodes. As for an advanced-super dimensional switching (ADS for short) array substrate, the pixel electrode and the common electrode are not arranged in the same layer, wherein the upper electrode is a strip electrode, the lower electrode is a plate electrode.

Certainly, the first electrode 17 may also be an anode or cathode. On such basis, a method for manufacturing the TFT array substrate further comprises: forming an organic material functional layer and a cathode or anode. Namely, when the first electrode 17 is an anode, an organic material functional layer and a cathode are further formed; when the first electrode 17 is a cathode, an organic material functional layer and an anode are further formed.

The organic material functional layer at least comprises an electron transport layer, a light emitting layer and a hole transport layer. In order to improve the efficiency of injecting the electrons and the holes into the light emitting layer, the organic material functional layer may further comprise an electron injection layer arranged between the cathode and the electron transport layer, and a hole injection layer arranged between the anode and the hole transport layer.

In terms of different materials of the anode and the cathode, display substrate may be divided into a single-side emitting flexible display substrate and a double-side emitting flexible display substrate. Namely, when the material of either of the anode and the cathode is an opaque material, the flexible display substrate is of a single-side emitting type; when the materials of the anode and the cathode are both transparent materials, the flexible display substrate is of a double-side emitting type.

The embodiments of the present disclosure further provide a display panel comprising the aforesaid array substrate.

The above display panel may specifically be a liquid crystal display panel or an organic electroluminescent diode display panel. When it is applied in a display device, it may be any product or component having display function such as liquid crystal display, liquid crystal television, digital frame, mobile phone, tablet computer, and so on. Of course, the above display device may also be an organic electroluminescent diode display device.

The above embodiments are just specific implementations of the present disclosure, but the protection scope of the present disclosure is not so limited. Any variation or substitution that can be easily conceived by the skilled person who is familiar with this technical field should be covered within the protection scope of the present disclosure. Therefore, the protection scope of the present disclosure shall be based on the protection scopes of the claims.

The invention claimed is:

1. A method for manufacturing a polysilicon thin film transistor, comprising: forming, on a substrate, a gate, an active layer, and a source and a drain outside the active layer; wherein forming said active layer comprises:
   forming a polysilicon layer on said substrate, said polysilicon layer comprising a channel region and extension regions;
   performing ion injection process in said extension regions to form lightly-doped regions close to two sides of said channel region and a source region and a drain region located respectively at one side of said lightly-doped regions far from said channel region, wherein side surfaces of the channel region directly contact the lightly-doped regions, and the lightly-doped regions penetrate through the active layer in a direction perpendicular to the substrate;
   employing halo ion injection process to form halo regions, the halo regions located between a portion of side surfaces of the lightly doped regions and a portion of a bottom surface of the active layer, wherein the halo regions directly contact the bottom surface of the active layer and directly contact only a portion of the side surface of the lightly-doped regions away from the gate, the bottom surface of the active layer is opposite to a top surface of the active layer, and the top surface of the active layer is farther from the substrate than the bottom surface of the active layer;
   wherein a type of ions injected into said halo regions is opposite to that of ions injected into said lightly-doped regions, an energy of ions injected into said halo regions is greater than that of ions injected into said lightly-doped regions, a dose of ions injected into said halo regions is smaller than that of ions injected into said lightly-doped regions.

2. The method according to claim 1, wherein forming said active layer comprises:
   forming a polysilicon layer on said substrate, said polysilicon layer comprising a channel region and extension regions;
   taking said gate formed above the channel region of said polysilicon layer as a barrier, performing first ion injection process in said extension regions not blocked by said gate, and employing halo ion injection process to form said halo regions at positions of said channel region which are close to said lightly-doped regions; wherein a type of ions injected by said first ion injection process is opposite to that of ions injected by said halo ion injection process, an energy of ions injected by said first ion injection process is smaller than that of ions injected by said halo ion injection process, a dose of ions injected by said first ion injection process is larger than that of ions injected by said halo ion injection process;

forming a first organic photosensitive resin pattern above said extension regions, said first organic photosensitive resin pattern covering said lightly-doped regions to be formed, performing second ion injection process by taking said first organic photosensitive pattern as a barrier to form said source region and said drain region, while said extension regions covered by said first organic photosensitive resin pattern forming said lightly-doped regions; wherein ion types of the second ion injection process and the first ion injection process are identical;

removing said first organic photosensitive resin pattern.

3. The method according to claim 2, wherein performing first ion injection process in said extension regions, and employing halo ion injection process to form said halo regions at positions of said channel region which are close to said lightly-doped regions, comprising:

firstly performing the first ion injection process in said extension regions, then employing the halo ion injection process to form said halo regions at the positions of said channel region which are close to said lightly-doped regions; or, firstly employing the halo ion injection process to form said halo regions at the positions of said channel region which are close to said lightly-doped regions to be formed, then performing the first ion injection process in said extension regions.

4. The method according to claim 1, wherein forming said active layer comprises:

forming a polysilicon layer on said substrate, said polysilicon layer comprising a channel region and extension regions;

forming a second organic photosensitive resin pattern above said polysilicon layer, said second organic photosensitive resin pattern exposing said source region and said drain region to be formed in said extension regions, and performing the first ion injection process by taking said second organic photosensitive resin pattern as a barrier to form said source region and said drain region;

removing said second organic photosensitive resin pattern, and performing the second ion injection process by taking said gate formed above the channel region of said polysilicon layer as a barrier to form said lightly-doped regions in the areas of said extension regions except said source region and said drain region, and employing the halo ion injection process to form said halo regions at the positions of said channel region which are close to said lightly-doped regions; wherein a type of ions injected by said second ion injection process is identical with that of ions injected by said first ion injection process and opposite to that of ions injected by said halo ion injection process, an energy of ions injected by said second ion injection process is smaller than that of ions injected by said halo ion injection process, a dose of ions injected by said second ion injection process is larger than that of ions injected by said halo ion injection process.

5. The method according to claim 4, wherein said performing the second ion injection process by taking said gate formed above said polysilicon layer as a barrier to form said lightly-doped regions in the areas of said extension regions except said source region and said drain region, and employing the halo ion injection process to form said halo regions at the positions of said channel region which are close to said lightly-doped regions, comprising:

taking said gate formed above said polysilicon layer as a barrier, firstly performing the second ion injection process to form said lightly-doped regions in the areas of said extension regions except said source region and said drain region, then employing the halo ion injection process to form said halo regions at the positions of said channel region which are close to said lightly-doped regions; or, taking said gate formed above said polysilicon layer as a barrier, firstly performing the halo ion injection process to form said halo regions at the positions of said channel region which are close to said lightly-doped regions to be formed, then performing the second ion injection process to form said lightly-doped regions in the areas of said extension regions except said source region and said drain region.

6. The method according to claim 1, wherein said halo ion injection process comprises:

when a bearing substrate of a halo ion injection machine where said substrate is placed is rotated to a predetermined angle and a predetermined inclination, performing first halo ion injection process;

rotating the bearing substrate of said halo ion injection machine by 90° with respect to said predetermined angle in a clockwise or anticlockwise direction, performing second halo ion injection process;

continuing to rotate the bearing substrate by 90° in the same direction as said second halo ion injection process, performing third halo ion injection process;

continuing to rotate the bearing substrate by 90° in the same direction as said third halo ion injection process, performing fourth halo ion injection process;

wherein said predetermined inclination is unchanged during the four halo ion injection processes.

7. The method according to claim 6, wherein, taking the plane of said polysilicon layer as a reference, said predetermined inclination is in an angular range of 0 to 30°.

8. The method according to claim 1, wherein the ions in said lightly-doped regions are of n-type, the ions in said halo regions are of p-type; or, the ions in said lightly-doped regions are of p-type, the ions in said halo regions are of n-type.

9. The method according to claim 2, wherein the ions in said lightly-doped regions are of n-type, the ions in said halo regions are of p-type; or, the ions in said lightly-doped regions are of p-type, the ions in said halo regions are of n-type.

10. The method according to claim 3, wherein the ions in said lightly-doped regions are of n-type, the ions in said halo regions are of p-type; or, the ions in said lightly-doped regions are of p-type, the ions in said halo regions are of n-type.

11. The method according to claim 4, wherein the ions in said lightly-doped regions are of n-type, the ions in said halo regions are of p-type; or, the ions in said lightly-doped regions are of p-type, the ions in said halo regions are of n-type.

12. The method according to claim 5, wherein the ions in said lightly-doped regions are of n-type, the ions in said halo regions are of p-type; or, the ions in said lightly-doped regions are of p-type, the ions in said halo regions are of n-type.

13. The method according to claim 6, wherein the ions in said lightly-doped regions are of n-type, the ions in said halo regions are of p-type; or, the ions in said lightly-doped regions are of p-type, the ions in said halo regions are of n-type.

14. The method according to claim 7, wherein the ions in said lightly-doped regions are of n-type, the ions in said halo regions are of p-type; or, the ions in said lightly-doped regions are of p-type, the ions in said halo regions are of n-type.

15. A polysilicon thin film transistor, comprising: a gate, an active layer arranged on a substrate, and a source and a drain outside the active layer, wherein said active layer comprises:

a channel region, a source region and a drain region, lightly-doped regions located between said channel region and said source region and between said channel region and said drain region, wherein side surfaces of the channel region directly contact the lightly-doped regions, and the lightly-doped regions penetrate through the active layer in a direction perpendicular to the substrate, and halo regions located between a portion of side surfaces of the lightly doped regions and a portion of a bottom surface of the active layer, wherein the halo regions directly contact the bottom surface of the active layer and directly contact only a portion of the side surface of the lightly-doped regions away from the gate, the bottom surface of the active layer is opposite to a top surface of the active layer, and the top surface of the active layer is farther from the substrate than the bottom surface of the active layer;

wherein a type of ions in said halo regions is opposite to that of ions in said lightly-doped regions.

16. The polysilicon thin film transistor according to claim 15, wherein the ions in said lightly-doped regions are of n-type, the ions in said halo regions are of p-type; or, the ions in said lightly-doped regions are of p-type, the ions in said halo regions are of n-type.

17. An array substrate comprising a polysilicon thin film transistor, said polysilicon thin film transistor comprising:

a gate, an active layer arranged on a substrate, and a source and a drain outside the active layer, wherein said active layer comprises:

a channel region, a source region and a drain region, lightly-doped regions located between said channel region and said source region and between said channel region and said drain region, wherein side surfaces of the channel region directly contact the lightly-doped regions, and the lightly-doped regions penetrate through the active layer in a direction perpendicular to the substrate, and halo regions located between a portion of side surfaces of the lightly doped regions and a portion of a bottom surface of the active layer, wherein the halo regions directly contact the bottom surface of the active layer and directly contact only a portion of the side surface of the lightly-doped regions away from the gate, the bottom surface of the active layer is opposite to a top surface of the active layer, and the top surface of the active layer is farther from the substrate than the bottom surface of the active layer;

wherein a type of ions in said halo regions is opposite to that of ions in said lightly-doped regions.

18. The array substrate according to claim 17, wherein the ions in said lightly-doped regions are of n-type, the ions in said halo regions are of p-type; or, the ions in said lightly-doped regions are of p-type, the ions in said halo regions are of n-type.

19. A display panel comprising an array substrate comprising a polysilicon thin film transistor, said polysilicon thin film transistor comprising:

a gate, an active layer arranged on a substrate, and a source and a drain outside the active layer, wherein said active layer comprises:

a channel region, a source region and a drain region, lightly-doped regions located between said channel region and said source region and between said channel region and said drain region, wherein side surfaces of the channel region directly contact the lightly-doped regions, and the lightly-doped regions penetrate through the active layer in a direction perpendicular to the substrate, and halo regions located between a portion of side surfaces of the lightly doped regions and a portion of a bottom surface of the active layer, wherein the halo regions directly contact the bottom surface of the active layer and directly contact only a portion of the side surface of the lightly-doped regions away from the gate, the bottom surface of the active layer is opposite to a top surface of the active layer, and the top surface of the active layer is farther from the substrate than the bottom surface of the active layer;

wherein a type of ions in said halo regions is opposite to that of ions in said lightly-doped regions.

20. The display panel according to claim 19, wherein the ions in said lightly-doped regions are of n-type, the ions in said halo regions are of p-type; or, the ions in said lightly-doped regions are of p-type, the ions in said halo regions are of n-type.

* * * * *